United States Patent
Conley

(10) Patent No.: US 7,947,128 B2
(45) Date of Patent: May 24, 2011

(54) ATOMIC LAYER EPITAXY PROCESSED INSULATION

(75) Inventor: Douglas J. Conley, Charlotte, NC (US)

(73) Assignee: Siemens Energy, Inc., Orlando, FL (US)

( * ) Notice: Subject to any disclaimer, the term of this patent is extended or adjusted under 35 U.S.C. 154(b) by 999 days.

(21) Appl. No.: 11/823,768

(22) Filed: Jun. 28, 2007

(65) Prior Publication Data

US 2009/0000541 A1  Jan. 1, 2009

(51) Int. Cl.
*C30B 21/04* (2006.01)

(52) U.S. Cl. ............ 117/89; 117/92; 117/103; 117/104; 117/105

(58) Field of Classification Search ............... 117/88, 117/92, 103–105
See application file for complete search history.

(56) References Cited

U.S. PATENT DOCUMENTS

| | | | | |
|---|---|---|---|---|
| 2,949,150 | A * | 8/1960 | Traynor, Jr. | 428/324 |
| 3,523,056 | A * | 8/1970 | Horning | 442/189 |
| 3,592,711 | A * | 7/1971 | De Senarclens et al. | 156/250 |
| 3,759,866 | A * | 9/1973 | Rogers, Jr. et al. | 523/427 |
| 6,103,382 | A * | 8/2000 | Smith et al. | 428/417 |
| 6,117,541 | A * | 9/2000 | Frisk | 428/327 |
| 6,200,914 | B1 * | 3/2001 | Schulten | 442/111 |
| 6,559,472 | B2 * | 5/2003 | Sandhu et al. | 257/31 |
| 6,845,734 | B2 * | 1/2005 | Carpenter et al. | 118/723 MW |
| 2002/0144838 | A1 * | 10/2002 | Fritzemeier et al. | 174/125.1 |
| 2004/0096587 | A1 * | 5/2004 | Sambasivan et al. | 427/378 |
| 2005/0172897 | A1 | 8/2005 | Jansen | |
| 2005/0186338 | A1 | 8/2005 | Roscheisen et al. | |
| 2007/0114704 | A1 | 5/2007 | Stevens et al. | |
| 2008/0193739 | A1 * | 8/2008 | Dickey et al. | 428/317.9 |
| 2009/0000541 | A1 * | 1/2009 | Conley | 117/105 |

OTHER PUBLICATIONS

Sammelselg et al, "TiO2 thin films by atomic layer deposition: a case of uneven growth at low temperature", Applied Surface Science 134, pp. 78-86, Mar. 14, 1998.*

Jeffrey R. Wank, Steven M. George, Alan W. Weimer; "Nanocoating individual cohesive boron nitride particles in a fluidized bed of ALD"; Power Technology, Apr. 8, 2004; pp. 59-69; vol. 142; XP002495046.

* cited by examiner

*Primary Examiner* — Robert M Kunemund

(57) ABSTRACT

In one embodiment the present invention provides for a method for depositing a thin film layer onto a composite tape 16, that comprises depositing at least one thin film layer of physically enhancing material 30 onto at least one portion of the composite tape. The depositing is accomplished by atomic layer epitaxy and the thin film layer is approximately 1-10 molecules thick.

16 Claims, 2 Drawing Sheets

__US 7,947,128 B2__

ATOMIC LAYER EPITAXY PROCESSED INSULATION

FIELD OF THE INVENTION

The field of the invention relates to the deposit of materials and layers to insulation via atomic layer epitaxy.

BACKGROUND

With the use of any form of electrical appliance, there is a need to electrically insulate conductors. With the push to continuously reduce the size and to streamline electrical and electronic systems there is a corresponding need to find better and more compact insulators and insulation systems.

Good electrical insulators, by their very nature, also tend to be good thermal insulators, which is undesirable. Thermal insulating behavior, particularly for air-cooled electrical equipment and components, reduces the efficiency and durability of the components as well as the equipment as a whole. It is desirable to produce electrical insulation systems having maximum electrical insulation and minimal thermal insulation characteristics.

Electrical insulation often appears in the form of insulating tapes, which themselves have various layers. Common to these types of tapes is a paper layer that is bonded at an interface to a fiber layer, both layers tending to be impregnated with a resin. A favored type of insulation material is a mica-tape. Improvements to mica tapes include catalyzed mica tapes as taught in U.S. Pat. No. 6,103,882. The mica-tape may be wound around conductors to provide extremely good electrical insulation. An example of this is shown in FIG. 1. Illustrated here is a coil 13, comprising a plurality of turns of conductors 14, which in the example illustrated here are assembled into a bakelized coil. The turn insulation 15 is prepared from a fibrous material, for example glass or glass and Dacron which is heat treated. Ground insulation for the coil is provided by wrapping one or more layers of composite mica tape 16 about the bakelized coil 14. Such composite tape may be a paper or felt of small mica flakes combined with a pliable backing sheet 18 of, for example, glass fiber cloth or polyethylene glycol terephthalate mat, the layer of mica 20 being bonded thereto by a liquid resinous binder. Generally, a plurality of layers of the composite tape 16 are wrapped about the coil depending upon voltage requirements. A wrapping of an outer tape 21 of a tough fibrous material, for example, glass fiber, may be applied to the coil.

Generally, multiple layers of the mica tape 16 are wrapped about the coil with sixteen or more layers generally being used for high voltage coils. Resins are then impregnated into the tape layers. Unfortunately this amount of insulation only further adds to the complications of dissipating heat. If the thermal conductivity, mechanical strength, or other physical characteristics of the tape components can be improved then electrical system will see a marked improvement. Other problems with the prior art also exist, some of which will be apparent upon further reading.

SUMMARY OF THE INVENTION

With the foregoing in mind, methods and apparatuses consistent with the present invention, which inter alia facilitates the addition of surface coatings to various insulative tapes layers, sub-layers and surfaces. Atomic layer epitaxy (ALE), also referred to as atomic layer deposition has the ability to deposit thin films of material onto surfaces. Due to poor surface selectivity and the mixed molecular nature of insulative tapes, particularly mica tapes, the materials deposited by ALE will readily bind to these surfaces. The surface coating may be done as the tape is being made, so that there are film layers within the produced tape. In addition or substitution to this, the surface coating may be applied to the final surfaces of the tapes.

Each film layer deposited by the ALE may be a part of a composite layer of film depositions. Since the ALE deposits extremely small amounts of material, forming films about 1-10 molecules thick, it may be desirable to apply 2 or more depositions to create a sufficiently thick composite layer. In addition, however, each of the sub-layers in a composite film may have different materials deposited. This may be done to provide different or complimentary benefits.

These and other objects, features, and advantages in accordance with the present invention are provided particular embodiments by a method for depositing a thin film layer onto a composite tape, that comprises depositing at least one thin film layer of physically enhancing material onto at least one portion of the composite tape. The depositing is accomplished by atomic layer epitaxy and the thin film layer is approximately 1-10 molecules thick. The physically enhancing material deposited onto the composite tape is formed from vapor precursors and becomes its final chemical nature after deposition.

In related embodiments the physically enhancing material is formed from oxide pre-cursors and water. The physically enhancing materials are chosen from the group consisting of $TiO_2$, $ZrO_2$, $HfO_2$, $Ta_2O_5$, $Nb_2O_5$, $Y_2O_3$, $CeO_2$, $La_2O_3$, $Al_2TiO_5$, $SrTiO_3$, $BaTiO_3$, $Al_2O_3$, $AlN$, $MgO$, $ZnO$, $BeO$, $BN$, $Si_3N_4$, $SiC$ and $SiO_2$, although in some embodiments $Al_2O_3$, $TiO_2$ and $SiO_2$ are most preferred.

In other related embodiments at least one thin film layer is a top sealer of the composite tape. Multiple thin film layers can be deposited, and in some embodiments at least two of the thin film layers comprise different types of physically enhancing material. Also a mica layer in the composite tape may have multiple thin film layers deposited on multiple sub-layers of the mica layer.

In other related embodiments the depositing of the physically enhancing layer is performed on loose mica flakes that are then formed into a mica layer in the composite tape. The depositing of the physically enhancing layer may be performed on a fabric layer of the composite tape, whereby the physically enhancing layer coats the fiber network of the fabric layer. In some embodiments the thin film layer comprises a composite of sub thin film layers, whereby a single thin film layer was made by multiple atomic layer epitaxy depositions.

In another embodiment the present invention provides for a method for depositing a thin film layer onto a composite tape, that comprises depositing at least one thin film layer of physically enhancing material onto a mica surface of the composite tape. The depositing is accomplished by atomic layer epitaxy, and the thin film layer is approximately 1-10 molecules thick.

Other embodiments of the present invention also exist, which will be apparent upon further reading of the detailed description.

BRIEF DESCRIPTION OF THE FIGURES

The invention is explained in more detail by way of example with reference to the following drawings.

DETAILED DESCRIPTION OF THE INVENTION

The present invention provides for a method and apparatus for depositing physically enhancing (PE) materials onto a composite tape via atomic layer epitaxy (ALE). Insulation such as composite tapes are very important in electrical systems to prevent voltage breakdown. Unfortunately, while guarding against voltage breakdown, the composite tapes also impede other desirable characteristics such as thermal conductivity, mechanical strength and general durability.

These other physical properties of the tapes can be enhanced by the addition of PE materials added directly to the various tape components. The PE materials are metallic and non-metallic inorganic oxides, nitrides, carbides or organometalics that form thin film layers on surfaces of the composite tape. The thin film layers may be applied to the surface of the tape as a whole and/or component layers, such as the fiber backing or individual mica flakes, which can then be combined to form the whole tape.

Atomic Layer epitaxy (ALE) is used to deposit the film of PE materials onto the various surfaces. The ALE process is achieve by putting samples in an ALE chamber, which is then voided and flooded with a relatively inert gas, such as nitrogen, and a gas containing the desired active ALE material. The active groups in the gas containing the desired ALE material attach with poor selectivity to surfaces. Subsequent to this, oxygen or moisture can be introduced into the chamber to provide the surface reaction creating the PE material. This produces a relatively uniform layer that is only a few molecules thick. This may then be repeated with the same gas, or new gasses may be introduced. In this manner, layers can be engineered by stacking molecular layers of different compounds to assemble multilayers and superlattices.

Figure 1:
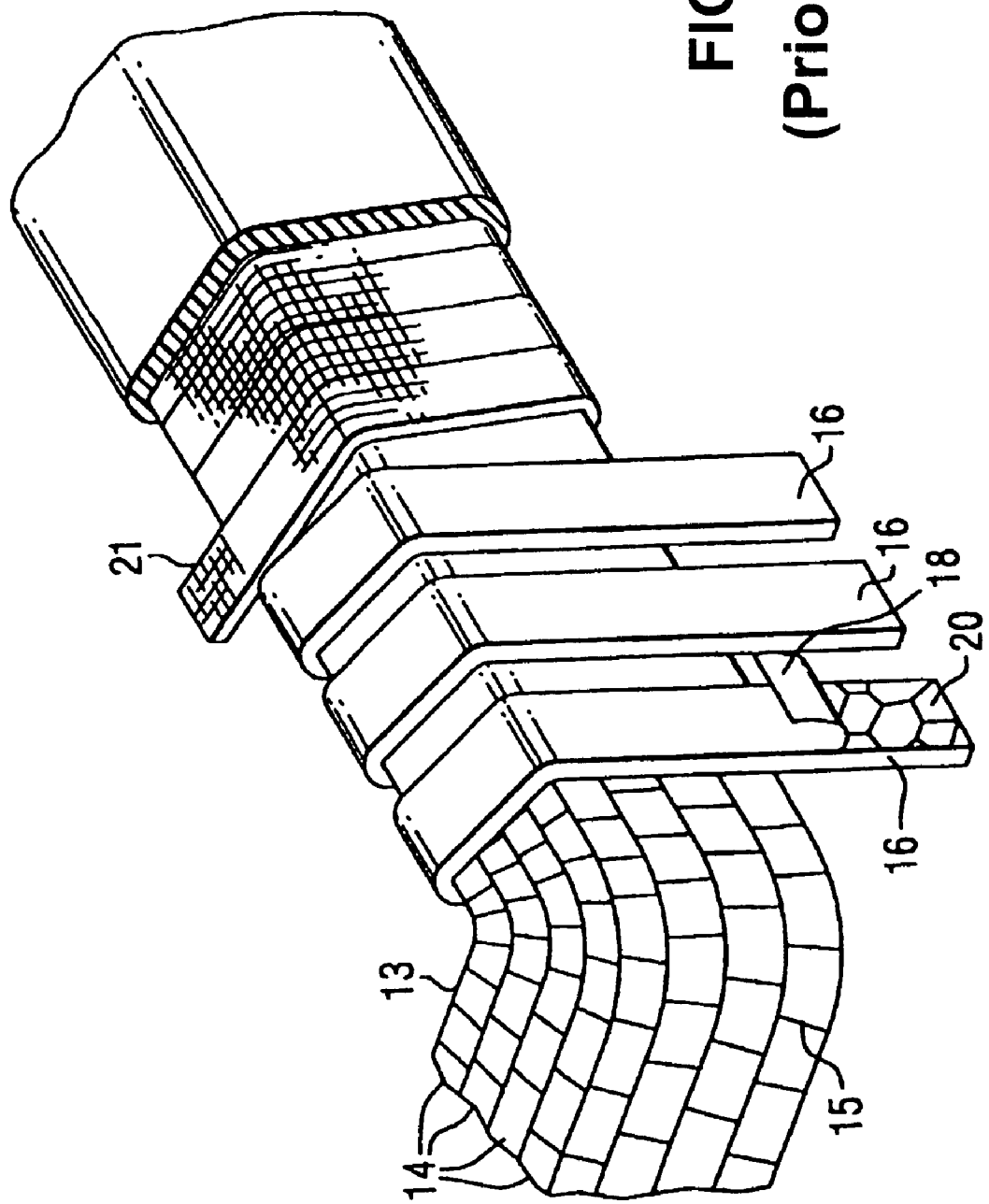
FIG. 1 illustrates a composite tape as used in the art.
Figure 2:
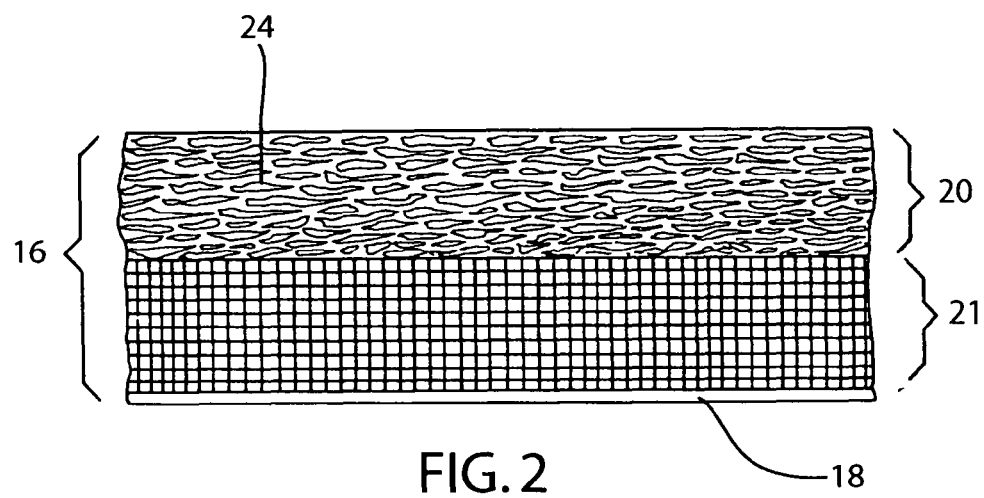
FIG. 2 illustrates a stylized close-up view of a cross-section of a typical composite tape as used with embodiments of the present invention.

FIG. 2 illustrates components of a composite tape 16 to which the PE materials can be applied. The mica layer 20, which is normally resistant to coating but with which the ALE process can readily react with, is comprised of many mica flakes 24. The mica layer is bonded to a backing, such as a glass fabric layer 21, and an additional backing 18 may be present on one or both sides. The layers depicted are stylized for illustration purposes and are not to exact scale. Since the tape is comprised of sub-layers, the coating of the various sub-layers presents a prime point in the tape making process to apply the thin film layer.

The various sub-layers of tape, however, also present their own additional approaches for additional ALE deposited thin film layers. A mica layer is a paper that is formed from many flakelets. These flakelets may be surface coated prior to being formed into a paper sub-layer. The inner layers and pores of the mica platelets can also be covered after the mica is formed into a paper within the mica paper.

Figure 3:
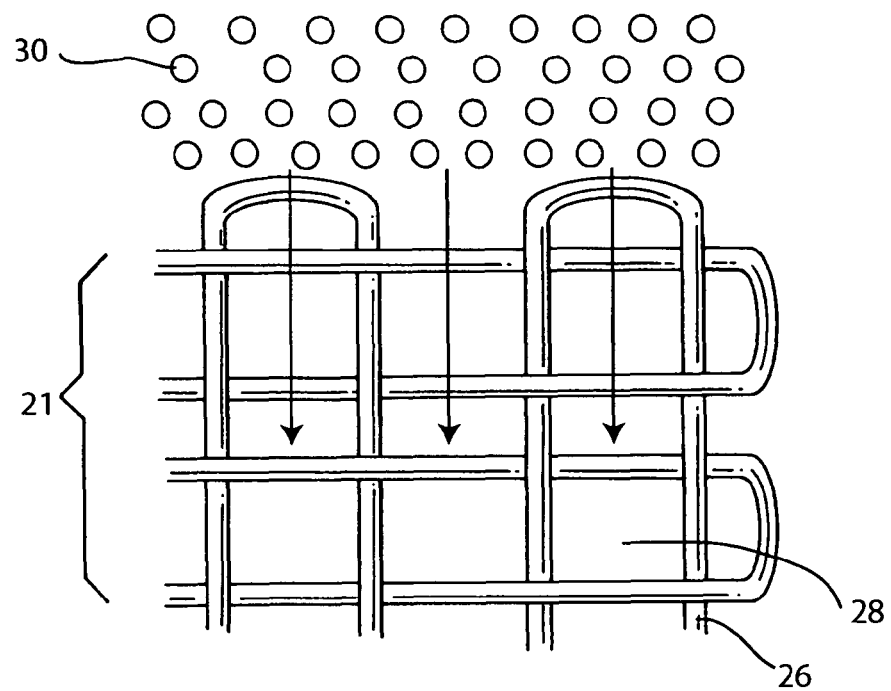
FIG. 3 illustrates a segment of a fibrous layer undergoing ALE.

The glass fiber layer 21, as illustrated in FIG. 3, is comprised of a glass fiber weave 26, but also contains relatively large areas of open space 28. The PE material cloud 30 from the ALE process can readily penetrate the weave, which can therefore form a thin film coating on the fabric strands 26 within the fabric layer. In these manners the thin film layers form three dimensional surface coatings. Therefore, the thin film layer may refer to a three dimensional coating of a tape component, as well as a more traditional two dimensional surface coating. The thin film PE layer may also be added to the tape prior to or after it being applied to an electrical apparatus.

A particular ALE method would utilize organo-precursors and moisture to eliminate the potential issues associated with ionic species and corrosive byproducts such as hydrochloric acid. Normally, ALE produces ionized species, and it is not typical to try and minimize or eliminate these byproducts. The present invention seeks to minimize the ionic species produced so that the final products have minimal electrical conductivity. A reaction using trimethylaluminum and water to produce aluminum oxide is as follows:

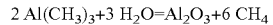

$$2\,Al(CH_3)_3 + 3\,H_2O = Al_2O_3 + 6\,CH_4$$

An alternative embodiment could also use the ALE to produce mixed oxides, nitrides and carbides as part of a mixed layered or superlattice structure.

The materials can form alternating layers and can provide multiple and complimentary benefits. One layer or set of layers can also be used as an interface to another layer, whereas the final layer or layers could be used to seal the structure or enhance bonding. Layers applied directly to the mica should be selected for high conductivity and being bondable to the mica by being mica like in characteristics such as expansion. Layers that are to be contacted with the resin can be made to bond better the resin to increase wetting, such as by including residual oxide or hydroxyl groups.

Boron nitride has been shown to have high thermal conductivity, while oxides such as aluminum oxide are known to enhance the resistance to partial discharge degradation. A list of possible PE materials includes $TiO_2$, $ZrO_2$, $HfO_2$, $Ta_2O_5$, $Nb_2O_5$, $Y_2O_3$, $CeO_2$, $La_2O_3$, $Al_2TiO_5$, $SrTiO_3$, $BaTiO_3$, $Al_2O_3$, $AlN$, $MgO$, $ZnO$, $BeO$, $BN$, $Si_3N_4$, $SiC$ and $SiO_2$. Particularly preferred PE materials are $Al_2O_3$, $TiO_2$ and $SiO_2$.

As discussed, insulating tapes tend to comprise a host matrix, such as mica, that is formed into a paper, that is often then impregnated with resin or accelerator or both. Before or after being impregnated, the paper used in tapes is added to a high tensile strength backing, such as glass or polymer film. The host matrix of an insulating tape acts as a very good electrical insulator, but also insulates thermally as well, which is an undesired side effect.

In addition to the standard mica (Muscovite or Phlogopite) that is typically used for electrical insulation there is also Biotite mica as well as several other Mica-like Alumino-Silicate materials such as Kaolinite, Halloysite, Montmorillonite and Chlorite. Montmorillonite has lattices in its structure which can be readily intercalated with PE materials such as metal cations, organic compounds and monomers and polymers to give high dielectric strength composites.

Also discussed earlier, electrical insulation tapes may comprise several distinct sub-layers. Examples given above include an electrically insulative layer, such as mica, and a strength layer, such as glass. The present invention can therefore also be applied to the various surface sub-layers of a tape, thereby improving the thermal conductivity, bonding, and/or other properties between the sub-layers. The coating of the sub-layer surface may be accomplished with the same materials mentioned and by the same processes, although the sub-layer surfaces will need to be coated prior to the tape being fully formed.

The various surface coatings can also impart improved or diminished physical properties to the tape. The change in qualities such as friction and tackiness will depend on the type of PE material chosen.

The tapes may be impregnated with resin before or after being applied to electrical objects. Resin impregnation techniques include VPI and GVPI, discussed more below. In VPI, once a tape is lapped and impregnated it is compressed. Once in position, the resin in the compressed tape is cured. In some embodiments the resin is cured in a two stage process, as will be apparent to one of ordinary skill in the art.

An additional advantage of the present invention is that the tapes will exhibit improved electrical properties such as dielectric strength, voltage endurance and corona resistance, which is the ability of insulation to withstand a specified level of field-intensified ionization to prevent its immediate, complete breakdown.

In one embodiment the present invention provides for a method for depositing a thin film layer onto a composite tape, that comprises depositing at least one thin film layer of physically enhancing material onto at least one portion of the composite tape. The depositing is accomplished by atomic layer epitaxy and the thin film layer is approximately 1-10 molecules thick. The physically enhancing material deposited onto the composite tape is formed from vapor precursors and becomes its final chemical nature after deposition and reaction at the surface.

In related embodiments the physically enhancing material is formed from oxide pre-cursors and water. The physically enhancing materials are chosen from the group consisting of $TiO_2$, $ZrO_2$, $HfO_2$, $Ta_2O_5$, $Nb_2O_5$, $Y_2O_3$, $CeO_2$, $La_2O_3$, $Al_2TiO_5$, $SrTiO_3$, $BaTiO_3$, $Al_2O_3$, AlN, MgO, ZnO, BeO, BN, $Si_3N_4$, SiC and $SiO_2$, although in some embodiments $Al_2O_3$, $TiO_2$ and $SiO_2$ are most preferred.

In other related embodiments at least one thin film layer is a top sealer of the composite tape. Multiple thin film layers can be deposited, and in some embodiments at least two of the thin film layers comprise different types of physically enhancing material. Also a mica layer in the composite tape may have multiple thin film layers deposited on multiple sub-layers of the mica layer.

In other related embodiments the depositing of the physically enhancing layer is performed on loose mica flakes that are then formed into a mica layer in the composite tape. The depositing of the physically enhancing layer may be performed on a fabric layer of the composite tape, whereby the physically enhancing layer coats the fiber network of the fabric layer. In some embodiments the thin film layer comprises a composite of sub thin film layers, whereby a single thin film layer was made by multiple atomic layer epitaxy depositions.

In another embodiment the present invention provides for a method for depositing a thin film layer onto a composite tape, that comprises depositing at least one thin film layer of physically enhancing material onto a mica surface of the composite tape. The depositing is accomplished by atomic layer epitaxy, and the thin film layer is approximately 1-10 molecules thick.

In related embodiments multiple thin film layers are deposited and at least two of the thin film layers comprise different types of physically enhancing material. The physically enhancing materials may be chosen from the group comprising $TiO_2$, $ZrO_2$, $HfO_2$, $Ta_2O_5$, $Nb_2O_5$, $Y_2O_3$, $CeO_2$, $La_2O_3$, $Al_2TiO_5$, $SrTiO_3$, $BaTiO_3$, $Al_2O_3$, AlN, MgO, ZnO, BeO, BN, $Si_3N_4$, SiC and $SiO_2$. In some embodiments the physically enhancing material acts as a sealer for the mica surface.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the inventions which, is to be given the full breadth of the claims appended and any and all equivalents thereof.

What is claimed is:

1. A method for depositing a thin film layer onto a composite tape, said composite tape having a plurality of layers including a backing layer that make the composite tape effective for and operable as an electrical insulator suitable to be wrapped around an electrical conductor and provide insulative properties, comprising:
   depositing at least one thin film layer of physically enhancing material onto at least one portion of said composite tape, said physically enhancing material causing the composite tape to be more thermally conductive, mechanically strong and durable;
   wherein the depositing is accomplished by atomic layer epitaxy;
   wherein said at least one thin film layer is approximately 1-10 molecules thick; and
   wherein said physically enhancing material deposited onto said composite tape is formed from vapor precursors and becomes its final chemical nature after deposition and reaction with said composite tape surface.

2. The method of claim 1, wherein the physically enhancing material is formed from oxide pre-cursors and water.

3. The method of claim 1, wherein said physically enhancing materials are chosen from the group consisting of $TiO_2$, $ZrO_2$, $HfO_2$, $Ta_2O5$, $Nb_2O_5$, $Y_2O_3$, $CeO_2$, $La_2O_3$, $Al_2TiO_5$, $SrTiO_3$, $BaTiO_3$, $Al_2O_3$, AlN, MgO, ZnO, BeO, BN, $Si_3N_4$, SiC and $SiO_2$.

4. The method of claim 1, wherein said physically enhancing materials are chosen from the group consisting of $Al_2O_3$, $TiO_2$ and $SiO_2$.

5. The method of claim 1, wherein at least one thin film layer is a top sealer of said composite tape.

6. The method of claim 1, wherein a plurality of thin film layers are deposited.

7. The method of claim 6, wherein at least two of said plurality of thin film layers comprise different types of physically enhancing material.

8. The method of claim 6, wherein a mica layer in said composite tape has a plurality of said thin film layers deposited on multiple sub-layers of said mica layer.

9. The method of claim 1, wherein the depositing of said physically enhancing layer is performed on loose mica flakes that are then formed into a mica layer in said composite tape.

10. The method of claim 1, wherein the depositing of said physically enhancing layer is performed on a fabric layer of said composite tape, whereby said physically enhancing layer coats the fiber network of said fabric layer.

11. The method of claim 1, wherein said at least one thin film layer comprises a composite of sub thin film layers, whereby a single thin film layer was made by multiple atomic layer epitaxy depositions.

12. The method of claim 11, wherein at least two of said sub thin film layers comprise different types of oxide materials.

13. A method for depositing a thin film layer onto a composite tape, said composite tape having a plurality of layers including a backing layer that make the composite tape effective for and operable as an electrical insulator suitable to be wrapped around an electrical conductor and provide insulative properties, comprising:
   depositing at least one thin film layer of physically enhancing material onto a mica surface of said composite tape, said physically enhancing material causing the composite tape to be more thermally conductive, mechanically strong and durable;

wherein the depositing is accomplished by atomic layer epitaxy; and wherein said at least one thin film layer is approximately 1-10 molecules thick.

14. The method of claim 13, wherein a plurality of thin film layers are deposited and where at least two of said thin film layers comprise different types of physically enhancing material.

15. The method of claim 13, wherein said physically enhancing materials are chosen from the group comprising $TiO_2$, $ZrO_2$, $HfO_2$, $Ta_2O5$, $Nb_2O_5$, $Y_2O_3$, $CeO_2$, $La_2O_3$, $Al_2TiO_5$, $SrTiO_3$, $BaTiO_3$, $Al_2O_3$, AlN, MgO, ZnO, BeO, BN, $Si_3N_4$, SiC and $SiO_2$.

16. The method of claim 13, wherein said physically enhancing material acts as a sealer for said mica surface.

* * * * *